Oct. 25, 1960 R. V. JENSEN ET AL 2,957,937

THERMOELECTRIC MATERIALS

Filed June 16, 1958

INVENTORS
FRED D. ROSI &
ROBERT V. JENSEN
BY
J. L. Whittaker
ATTORNEY 2,957,937
Patented Oct. 25, 1960

1

2,957,937

THERMOELECTRIC MATERIALS

Robert V. Jensen, Fairless Hills, Pa., and Fred D. Rosi, Plainsboro, N.J., assignors to Radio Corporation of America, a corporation of Delaware Filed June 16, 1958, Ser. No. 742,265

4 Claims. (Cl. 136—5)

Figure 1:
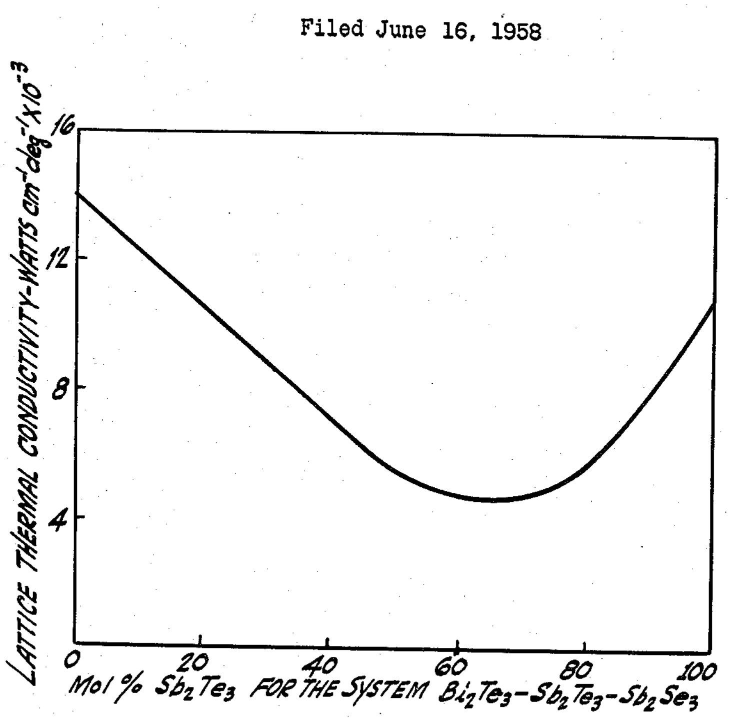

This invention relates in general to improved thermoelectric materials and in particular to improved thermoelectric alloys.

When two conductors of dissimilar metals have their ends joined as by brazing so as to form a continuous loop, a pair of junctions is established between the respective ends so joined. If now the two junctions are at different temperatures, an electromotive force will be set up in the circuit thus formed. This effect is called the thermoelectric or Seebeck effect, and the device is called a thermocouple. Many arrangements of the two conductors are possible: for example, the electromotive force may be read as a function of temperature by leaving one end of each conductor unjoined and connecting them to a galvanometer. Such an arrangement is called a thermocouple thermometer. A second junction still exists in such a thermometer and is constituted by the joinder of each of the free ends of the conductors by means of the galvanometer. Alternatively, the opposite effect, that is a temperature increase or decrease, may be achieved at each one of the junctions respectively by passing a current through the junctions. This is termed the Peltier effect.

Thermoelectric materials are classified as either N-type or P-type depending upon whether current conduction in the materials is provided by holes or electrons. If the material is doped with donor atoms so as to have an excess number of electrons it is called N-type. If the material is doped with acceptor atoms so as to have an excess number of holes, it is called P-type. The present invention relates to an improved P-type thermoelectric material. The present invention relates to both improved N-type and P-type thermoelectric elements.

One requirement for efficient thermoelectric devices is a high electromotive force per degree difference in temperature between junctions. This is referred to as the thermoelectric power of the material. Another requirement is that the thermoelectric material have low heat or thermal conductivity since a sharp temperature gradient between adjacent junctions would be difficult to maintain if the material between junctions was a good heat conductor.

Still another requirement for a good thermoelectric material is high electrical conductivity or, conversely, low electrical resistivity. This is apparent since the temperature of the cold junction would be increased if the current passing through the junction generated joulean heat.

Since the practical application of thermoelectric effects is then, to a large extent, a materials problem, it is most desirable to have a figure of merit which characterizes the potential value of various material for thermoelectric applications. From efficiency considerations a figure of merit for thermoelectric materials has been proposed.

2

The figure of merit for thermoelectric materials varies directly as the square of the thermoelectric power Q and inversely with the product of the electrical resistivity $p$ and thermal conductivity K; that is, $Q^2/pK$. The validity of the figure of merit as an indication of the usefulness of the materials in practical applications is well established. Thus, as an objective, high thermoelectric power, high electrical conductivity, and low thermal conductivity are desired. As the electrical and thermal conductivities are related, this objective becomes the provision of a material with maximum ratio of electrical to thermal conductivities and a high thermoelectric power.

The thermal conductivity K comprises a component due to lattice heat conduction and a component due to electronic heat conduction. Extensive studies have shown that it is possible to reduce K by substitutionally alloying into the semiconductor lattice another component which crystallizes in a similar lattice and has approximately the same lattice constant. It is theorized that the substitutional alloying introduces strains into the crystal lattice, which lowers the mean free path of phonons without, at the same time, scattering electrons which have longer wavelengths than the phonons. Hence, the lattice thermal conductivity is decreased by alloying without changing the thermoelectric power for a given resistivity.

To achieve low electrical resistivity, semiconductor materials for thermoelectric applications operate at conditions near degeneracy. That is, the semiconductor materials are heavily doped with free charge carriers so that they almost lose their semiconducting properties. This requires the addition of ionized impurities in amounts to provide free charge carrier concentrations in the range of $10^{18}$ to $10^{20}$ per cubic centimeter. However, such a requirement limits the choice of doping materials to those having a high solid solubility in the thermoelectric semiconductor materials. To achieve low electrical resistivity, the problem is then to find chemical compounds having high solubility in the thermoelectric alloy system under consideration and which also provides a desired type of conductivity in the alloy.

It is accordingly an object of the invention to provide improved thermoelectric materials having higher figures of merit than heretofore obtainable.

Another object of the invention is to provide improved thermoelectric materials by the technique of substitutional alloying.

A further object is to provide improved thermoelectric alloys of N-type conductivity.

Another object is to provide improved thermoelectric alloys having free charge carrier concentrations between $10^{18}$ and $10^{20}$ per cubic centimeter.

The present invention provides improved thermoelectric materials having thermoelectric properties significantly better than those of the best previously known materials. In addition, the materials of the invention are relatively simple to prepare. According to one feature of the invention a preferred alloy composition comprises bismuth telluride alloyed with from 5–70 mol percent antimony telluride. Another improved alloy according to the invention includes, in addition to these compounds, from 1–25 mol percent antimony selenide. These new alloys may be made more P-type by including from 0.5 to 2.5 mol percent excess bismuth. In accordance with another feature of the invention, these alloys may be made N-type by doping with the chlorides, bromides and iodides of bismuth or antimony.

Figure 2:
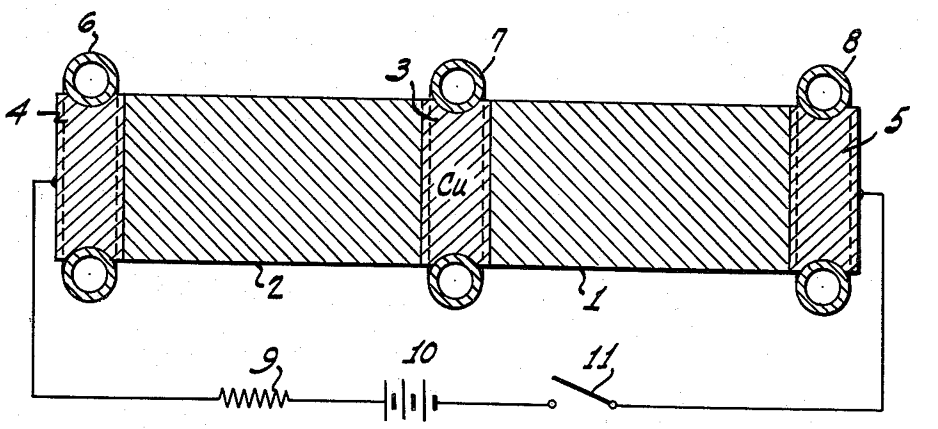

The invention will be described in greater detail by reference to the accompanying drawings of which:

Figure 1 is a graph of the variation of lattice thermal conductivity versus alloy composition; and, Figure 2 is a schematic, cross-sectional, elevational view of a thermoelectric element according to the invention.

Referring to Figure 1, a graph of the variation of the lattice component of thermal conductivity versus the mol percentage of antimony telluride in one of the improved alloys is shown. The reduction in lattice thermal conductivity is clearly seen. The amount of antimony selenide in the alloy is not specified in this figure since this component does not appreciably contribute to the reduction of thermal conductivity but serves another purpose. It acts to increase the band gap of the bismuth telluride and antimony telluride to the value which would be obtained for bismuth telluride alone. This increase in band gap prevents overlap of the undesirable effects of degeneracy and ambipolar contribution to thermal conductivity. It has been experimentally determined that from 1 to 25 mol percent antimony selenide is required for this purpose. However, for many applications, an improved thermoelectric alloy of bismuth telluride and antimony telluride alone is very useful.

P-type thermoelectric alloys according to the present invention consist principally of 5–70 mol percent antimony telluride ($Sb_2Te_3$) with the remainder bismuth telluride ($Bi_2Te_3$) or 5–70 mol percent antimony telluride, 1–25 mol percent antimony selenide ($Sb_2Se_3$) with the remainder $Bi_2Te_3$. Higher conductivity P-type thermoelectric materials are obtained by including in the alloy from 0.5 to 2.5 mol percent excess bismuth. One preferred P-type alloy consists of 75 mol percent $Bi_2Te_3$, 20 mol percent $Sb_2Te_3$ and 5 mol percent $Sb_2Se_3$. For this preferred alloy, thermal conductivity measurements at room temperature indicate a lattice contribution to the thermal conductivity of approximately .008 watt centigrade$^{-1}$ degree$^{-1}$. This very low value is seen to be an appreciable improvement when compared with a lattice component of approximately 0.013 watt centigrade$^{-1}$ degree$^{-1}$ obtained for pure $Bi_2Te_3$. In addition, this alloy exhibited a figure of merit of $2.4 \times 10^{-3}$ degrees$^{-1}$, which is the highest published to date for any P-type thermoelectric material.

The N-type thermoelectric alloys according to the present invention consist principally of 5–70 mol percent $Sb_2Te_3$ with the remainder $Bi_2Te_3$ or 5–70 mol percent $Sb_2Te_3$, 1–25 mol percent $Sb_2Se_3$ with the remainder $Bi_2Te_3$ to which from 0.01 to 1.0 weight percent of the chlorides, bromides and iodides of bismuth or antimony added as doping materials, based on the total weight of the bismuth, tellurium, antimony and selenium in the alloy. The additive may consist entirely of any one of these materials or any combination thereof. An impurity range of from approximately .01 to 1.0 weight percent was found to provide the range of materials having desirable thermoelectric properties, that is, having electrical conductivities up to 10,000 ohm$^{-1}$ centimeter$^{-1}$. The elements, iodine, chlorine and bromine, have been found to have sufficient solubility in the alloys to provide the desired electron concentrations of the order of $10^{18}$ to $10^{20}$ per cubic centimeter. These elements were introduced in the form of the halides of bismuth and antimony, i.e., $BiCl_3$, $BiBr_3$, $BiI_3$ and $SbCl_3$, $SbBr_3$ and $SbI_3$.

The described doping materials are particularly useful in thermoelectric alloys containing compounds of antimony because no other doping materials have yet been found which would provide N-type conductivity in such alloys. Other specific advantages of using the halides of bismuth and tellurium are: (1) the segregation coefficients of the doping or impurity compounds in the thermoelectric materials are close to unity, which provides uniform carrier concentration and electrical conduction along the thermoelement, (2) thermoelectric materials doped with these compound impurities do not exhibit annealing or "aging" effects.

The alloys of the invention are easily prepared by melting the proper combinations of bismuth, tellurium, selenium and antimony, and the chlorides, bromides or iodides of bismuth or antimony. The materials may be melted in a quartz ampule, for example, at a temperature of about 750° C. and allowed to react for about 6 hours. Slow cooling, as by the gradient freeze technique, then provides the solidified material.

A preferred P-type alloy of the invention was prepared by melting the following constituents:

| | Grams |
|---|---|
| Bismuth | 40.40 |
| Tellurium | 46.8 |
| Antimony | 7.86 |
| Selenium | 1.53 |

A preferred N-type alloy was prepared by melting the following stoichiometric proportions of the constituents:

| | Grams |
|---|---|
| Bismuth | 41.40 |
| Tellurium | 45.6 |
| Selenium | 1.65 |
| Antimony | 11.4 |
| Antimony tri-iodide | 0.1 to 0.5 |

This preferred N-type alloy exhibited a figure of merit of $2.7 \times 10^{-3}$ degree$^{-1}$ which is also the highest value published to date for an N-type thermoelectric material.

Referring now to Figure 2, a thermocouple circuit utilizing the materials of the invention is shown. The couple is composed of N-type and P-type thermoelectric elements 1 and 2 which are conductively joined by an intermediate conductive part 3 of a metal having high electrical and thermal conductivity. The element 1 may consist of one of the preferred alloys specified hereinbefore. The element 2 may consist of any desired thermoelectric composition complementary to the alloy of member 1. The intermediate part 3 which connects the differential elements to form a thermoelectric junction between them consists preferably of copper.

An energizing circuit comprising a current source 10, a resistor 9 and a control switch 11 is connected to the couple through copper end terminals 4 and 5. The end terminals are provided with single turn pipe coils 6 and 8 through which a heat transporting fluid may be pumped to maintain them at a relatively constant temperature. Thus, when the action of the current through the thermoelectric junction produces a temperature differential between the intermediate terminal 3 and the end terminals, the end terminals may be maintained at a constant temperature and the intermediate one may be reduced in temperature.

There have thus been described improved thermoelectric materials of novel composition which possess advantageous thermoelectric properties and which are easily prepared. Thermoelectric elements made from these materials are useful in various applications, such as heating, refrigeration and air conditioning.

What is claimed is:

1. A thermoelectric alloy consisting essentially of bismuth telluride, 5–70 mol percent antimony telluride, 1–25 mol percent antimony selenide, and from .01 to 1 percent by weight of at least one compound selected from the group consisting of the chlorides, bromides and iodides of bismuth and antimony.

2. A thermoelectric couple comprising two thermoelectric elements of semiconductor materials, said elements being conductively joined to form a thermoelectric junction, at least one of said two elements consisting of an alloy of bismuth telluride, 5–70 mol percent antimony telluride, 1–25 mol percent antimony selenide with from .01 to 1 percent by weight of at least one compound selected from the group consisting of the chlorides, bromides and iodides of bismuth and antimony.

3. A thermoelectric alloy consisting essentially of bismuth telluride, 5–70 mol percent antimony telluride and from .01 percent by weight to 1 percent by weight of at least one compound selected from the group consisting of the chlorides, bromides and iodides of bismuth and antimony.

4. A thermoelectric couple comprising two thermoelectric elements of semiconductor materials, said elements being conductively joined to form a thermoelectric junction, at least one of said two elements consisting of an alloy of bismuth telluride, 5–70 mol percent antimony telluride and from .01 to 1 percent by weight of a compound selected from the group consisting of the chlorides, bromides and iodides of bismuth and antimony.

References Cited in the file of this patent

UNITED STATES PATENTS 2,762,857 Lindenblad -------------- Sept. 11, 1956

OTHER REFERENCES

Telkes: Journal of Applied Physics, vol. 18, 1947, pp. 1116–1127.